United States Patent [19]

Yoshikawa et al.

[11] Patent Number: 4,553,674
[45] Date of Patent: Nov. 19, 1985

[54] CASING CONSTRUCTION FOR ELECTRONIC EQUIPMENT

[75] Inventors: Hiroshi Yoshikawa, Fujisawa; Tetsuya Hattori, Yokohama; Hideaki Sato, Kanagawa, all of Japan

[73] Assignee: Hitachi, Ltd., Tokyo, Japan

[21] Appl. No.: 344,185

[22] Filed: Jan. 28, 1982

[30] Foreign Application Priority Data

| Jan. 30, 1981 | [JP] | Japan | 56-11182[U] |
| Aug. 12, 1981 | [JP] | Japan | 56-118777[U] |
| Sep. 30, 1981 | [JP] | Japan | 56-144139[U] |
| Dec. 11, 1981 | [JP] | Japan | 56-183641[U] |
| Dec. 11, 1981 | [JP] | Japan | 56-183642[U] |
| Dec. 11, 1981 | [JP] | Japan | 56-198533 |
| Dec. 11, 1981 | [JP] | Japan | 56-198534 |
| Dec. 14, 1981 | [JP] | Japan | 56-200169 |

[51] Int. Cl.$^4$ ............................................. A47F 5/00
[52] U.S. Cl. ....................................... 211/26; 211/41; 211/189; 361/415
[58] Field of Search .............. 211/41, 26, 189, 186, 211/187; 361/383, 384, 391, 415, 428

[56] References Cited

U.S. PATENT DOCUMENTS

| 2,467,828 | 4/1949 | Hodgkins et al. | 361/428 |
| 2,959,715 | 11/1960 | Leonchick | 361/391 X |
| 3,192,306 | 6/1965 | Skonnord | 361/384 X |
| 3,231,785 | 1/1966 | Calabro | 361/383 X |
| 3,387,648 | 6/1968 | Ward et al. | 361/384 X |
| 4,002,381 | 1/1977 | Wagner et al. | 361/415 X |
| 4,305,114 | 12/1981 | Takagi et al. | 361/391 X |
| 4,353,469 | 10/1982 | Etchison et al. | 361/415 X |

FOREIGN PATENT DOCUMENTS

2635445   7/1978   Fed. Rep. of Germany ...... 361/384

Primary Examiner—Robert W. Gibson, Jr.
Attorney, Agent, or Firm—Antonelli, Terry & Wands

[57] ABSTRACT

A casing construction including a left post and a right post, each of the left post and the right post being large in width and formed at its front surface with a mounting portion for mounting a plurality of shelves in a plurality of vertically arranged layers, at its rear surface with a mounting portion for mounting a back board, a mounting portion at its upper end for mounting a ceiling board and a mounting portion at its lower end for mounting a floor board. The left post and right post having a variety of functions to perform have the shelves, back board, ceiling board and floor board threadably connected thereto. In this casing construction, the left post and right post perform the function of separating the shelves from cables. A plurality of such casings can be arranged in side-by-side relation to provide a series of casings depending on the size of the electronic equipment intended.

11 Claims, 23 Drawing Figures

CASING CONSTRUCTION FOR ELECTRONIC EQUIPMENT

FIELD OF THE INVENTION

This invention relates to a casing construction suitable for use with electronic equipment or a communication apparatus, for example, which comprises a plurality of electronic circuit units (hereinafter shelves arranged vertically, each electronic circuit unit comprising a plurality of electronic circuit packages.

DESCRIPTION OF THE PRIOR ART

Figure 1:
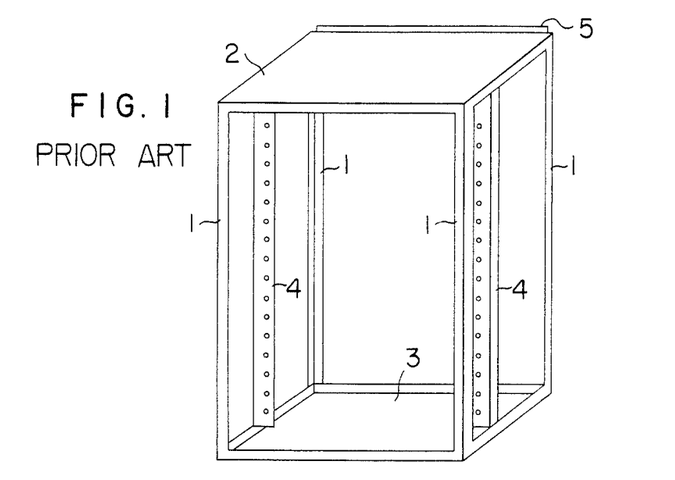
FIG. 1 is a perspective view of a skeleton structure of a unitary casing of the prior art.
Figure 2:
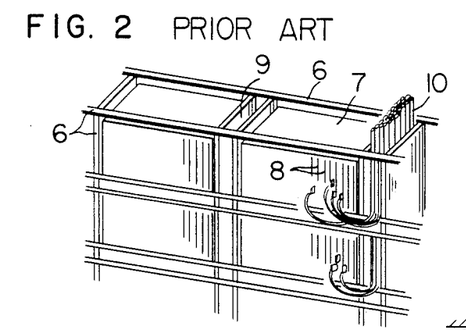
FIG. 2 is a perspective view of a skeleton structure comprising a plurality of casings formed in a unit of the prior art.

The construction of a casing of the prior art will be outlined by referring to FIGS. 1 and 2. FIG. 1 is a perspective view of a skeleton structure of a unitary casing, and FIG. 2 is a perspective view of a skeleton structure in which a plurality of casings are formed as a unitary structure in accordance with the scale of the electronic equipment.

The skeleton structure of the unitary casing shown in FIG. 1 comprises four support posts 1, a ceiling board 2, a floor board 3, a back board 5, and two shelf mounting posts 4.

These parts are joined together by welding, and this makes it necessary to use assembling jigs for performing welding which is carried out in a plurality of steps. The casing is large in size, so that the application of paint must be performed in a plurality of steps by using painting equipment of large size. This makes it difficult, if not impossible, to automate painting.

Shelves each comprising a plurality of electronic circuit packages are mounted between the two shelf mounting posts 4. In mounting the shelves, the two posts 1 located in the front of the structure have interfered with the operation and the mounting efficiency has hitherto been low with respect to the shelves.

When cables are connected to the front side of the electronic circuit packages mounted on the shelves, the cables extend along the side of the casing. In inserting and withdrawing the shelves after the cables are passed along the side of the casing, attention should be paid to the protection to be provided to the cables because the cables and the shelves are positioned against each other.

When a plurality of casings are arranged in side-by-side relation, it has been customary, as shown in FIG. 2, to assemble a unitary skeleton structure by using angle pieces 6 and then mount in predetermined positions shelves 7 each containing a plurality of electronic circuit packages 8 at the site of installation, to thereby complete the desired electronic equipment. The construction of this casing of the prior art has suffered many disadvantages. The angle pieces 6 should be packed and transported in large numbers, and assembling of the parts at the site of installation is a time-consuming operation which should be performed by making adjustments of the various parts. Since the structure built is a skeleton construction a cable area 9 is invaded by the angle pieces 6 and cables 10 must be drawn one by one into the cable area 9, so that it takes a considerably large number of steps to pull in the cables 10.

In the two examples shown and described hereinabove, attachments, such as side boards, a front door, a front cover, etc., should be provided with specific metal fixtures for fixing them in place. This increases the number of parts and the operation steps involved in building a casing.

SUMMARY OF THE INVENTION

Accordingly an object of this invention is to provide a casing for electronic equipment small in the number of component parts and requiring a reduced number of installation steps that can be built with a high degree of efficiency.

Another object is to provide a casing for electronic equipment in which protection is provided to the cables and the number of cable drawing steps is reduced.

Still another object is to provide a casing for electronic equipment in which mounting of convection inducing plates for promoting convection of the air heated by the electronic circuits and the mounting of the shelves are facilitated.

A further object is to provide a casing for electronic equipment which permits a plurality of casings to be built in side-by-side relation depending on the scale of the electronic equipment.

The outstanding characteristic of the invention is that the casing construction comprises a left post and a right post of a large width having a mounting portion in the front for mounting a plurality of shelves, a mounting portion at the back for attaching a back board, a mounting portion at an upper end for attaching a ceiling board, and a mounting portion at a lower end for attaching a floor board. The left post and the right post performing such multiple function have the shelves, back board, ceiling board and floor board threadably connected thereto, and the cables and shelves are separated from each other by left post and the right post.

Additional and other objects, features and advantages of the invention will become apparent from the description set forth hereinafter when considered in conjunction with the accompanying drawings.

DETAILED DESCRIPTION OF THE PREFERRED EMBODIMENTS

Preferred embodiments of the invention will now be described by referring to the accompanying drawings.

The most important constructional features of the invention comprise a pair of side posts or a left post and a right post arranged on opposite sides of the casing. The left post and the right post are large in width and each perform the functions which combine those of the two support posts 1 and the shelf mounting post 4 interposed therebetween as shown in FIG. 1.

Figure 3:
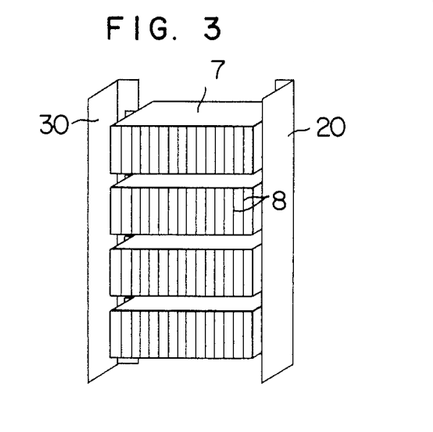
FIG. 3 is a perspective view of a casing developed in the process leading to the present invention.
Figure 4:
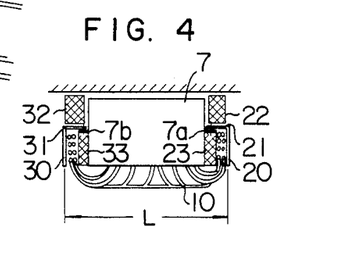
FIG. 4 is a top plan view of the casing shown in FIG. 3.
Figure 5:
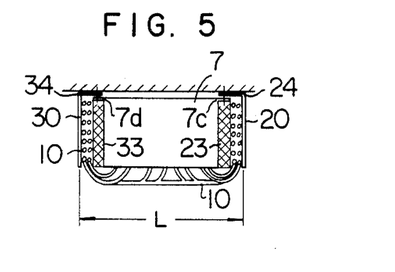
FIG. 5 is a top plan view of a modification of the casing shown in FIG. 3.

In providing side posts of large width, we paid special attention to improving operability in mounting the shelves, space efficiency for the cables and separability of the cables from the shelves. FIGS. 3–5 show an example in which a right post 20 and a left post 30 are formed in L-shape in the process leading to the present invention.

Referring to FIGS. 3 and 4, the shelf 7 has on opposite sides thereof mounting portions 7a and 7b threadably connected to bent portions 21 and 31 of the right and left posts 20 and 30 respectively, as shown in a perspective view and a top plan view. In this example, the right post 20 and the left post 30 each perform the function of the support posts 1 and the mounting post 1. This example has proved to be low in operability in mounting the shelves 7. First of all, difficulties are experienced in having access to an intermediate portion of the shelf 7 on its side to secure it to the side post 20 (30). Also, cables 10 are low in space efficiency because spaces 22 and 32 rearwardly of the bent portions 21 and 31 cannot be used as spaces for the cables 10 when the latter are connected through connectors to electronic circuit packages 8 in the front of the shelf 7. In the front of the bent portions 21 and 31, spaces 23 and 33 near the shelf 7 in the front thereof should be kept aside for screwing the shelf 7.

In FIG. 5, mounting portions 7c and 7d of the shelf 7 are located in the rear. In this constructional form, the cables 10 that can be accommodated are twice as large in number as the cables 10 accommodated in the constructional form shown in FIG. 4. However, the constructional form shown in FIG. 5 is lower in operability in mounting the shelf 7 than the constructional form shown in FIG. 4, because the spaces 23 and 33 in the front of bent portions 24 and 34 of the right post 20 and the left post 30 respectively are dead spaces for screwing the shelf 7 and a threadably connecting portion is located deep in the rear.

The side posts in the form of a letter L shown in FIGS. 3–5 are low in operability in mounting the shelf 7 and space efficiency for the cables 10. Thus in deciding the width of the casing on the basis of the provision of a cable accommodating space as a prerequisite, this constructional form has the disadvantage that the casing as a whole becomes large in size as the width L becomes large due to the presence of dead spaces 22, 23, 32 and 33.

Figure 6:
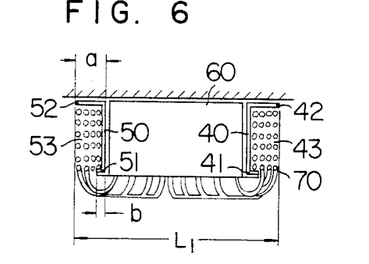
FIG. 6 is a top plan view of the casing comprising one embodiment of the invention.

In view of the need to increase operability in mounting the shelves, space efficiency for the cables and separability of the cables from the shelves, the right post and the left post according to the invention are essentially constructed as shown in FIG. 6.

Referring to FIG. 6 which is a top plan view of the casing comprising one embodiment of the invention, a right post 40 and a left post 50 each substantially in the form of a letter U in a lying position include mounting portions 41 and 51 located in the front for mounting a shelf 60 and bent portions 42 and 52 for protecting cables 70 and reinforcing the posts 40 and 50 respectively. The cables 70 are accommodated in spaces 43 and 53 defined by the posts 40 and 50 in the form of a letter U in the lying position. With a view to facilitating the arrangement whereby the casings are arranged in side-by-side relation, the mounting portions 41 and 51 of the posts 40 and 50 each have a dimention b which is smaller than the dimension a of the bent portions 42 and 52 in the rear to ensure that the space necessary for introducing and removing the cables 70 is provided. The shelf 60 is connected to the posts 40 and 50 on the surfaces of the mounting portions 41 and 51 of the dimension b as by screwing.

It will be seen that the casing shown in FIG. 6 has a width L which is smaller than the width L of the casing shown in FIG. 5 by an amount corresponding to the dead spaces 22, 23, 32, and 33 that are eliminated in the constructional form shown therein. Additionally the provision of the shelf mounting portions 41 and 51 in the front of the posts is conductive to improved operability in mounting the shelf 60. What is more important that since the cables 70 are separated from the shelf 60 by the right post 40 and the left post 50, a protection is provided to the cables 70 when the shelves 60 are introduced and removed.

Figure 7:
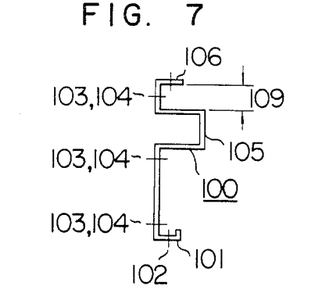
FIG. 7 is a top plan view of the right post used in the invention.
Figure 8:
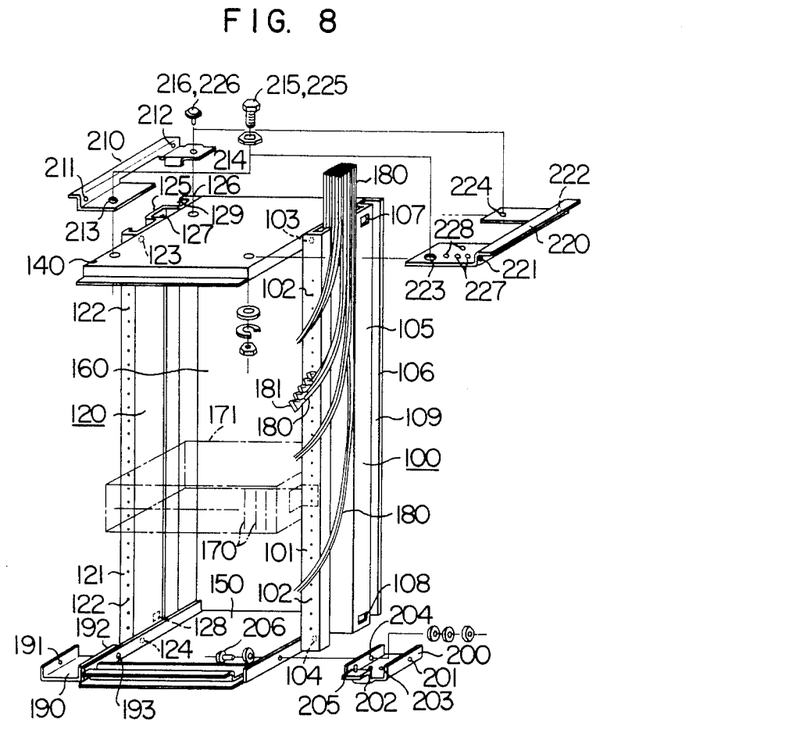
FIGS. 8 and 9 are perspective views of the casing according to the invention, showing the manner in which it is assembled.
Figure 9:
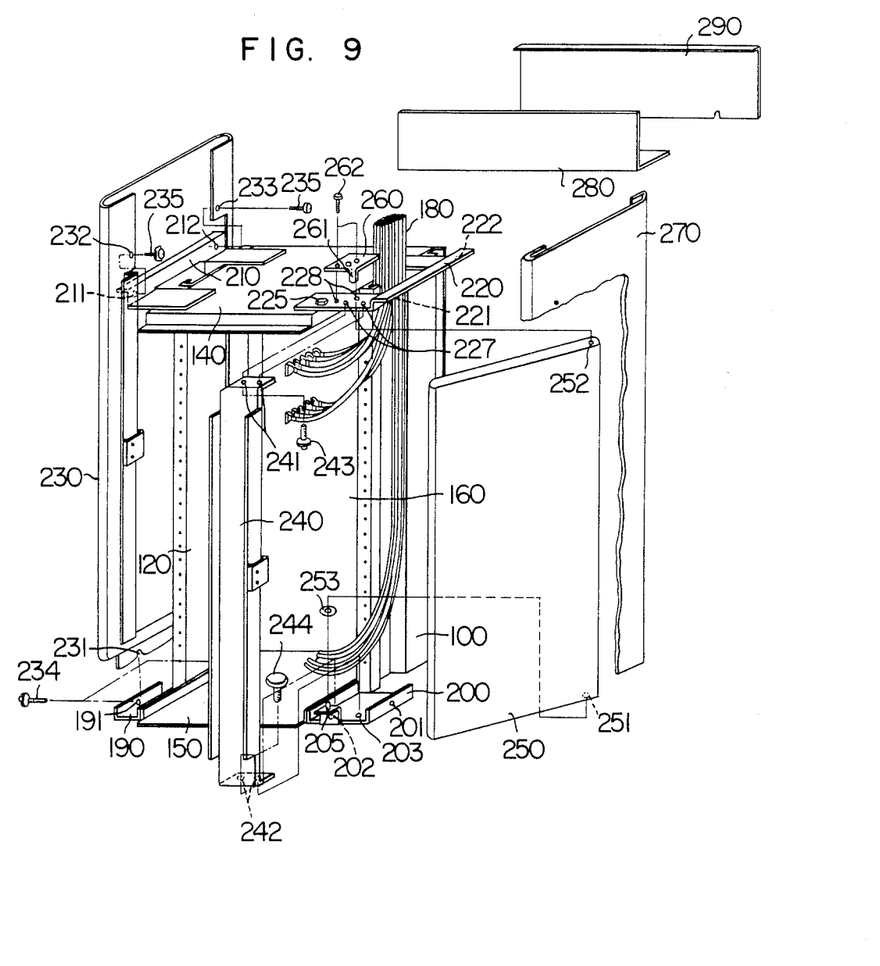

The invention will now be described in more detail by referring to an embodiment of more concrete construction. FIG. 7 is a top plan view of the right post of the casing comprising a second embodiment. The left post is a mirror image of the right post, so that only the right post of the second embodiment is shown and described. FIGS. 8 and 9 are fragmentary exploded perspective views of the casing including the right post (left post) shown in FIG. 7, showing the manner in which the casing is assembled.

A right post 100 and a left post 120 of the casing according to the invention include, as shown in FIGS. 7, 8 and 9, shelf mounting portions 101 and 121 located in the front and formed with shelf mounting threaded openings 102 and 122, mounting openings 103 and 123 formed in an upper portion for mounting a ceiling board 140, mounting openings 104 and 124 formed in a lower portion for mounting a floor board 150, bent portions 105 and 125 projecting in the form of a rectangle from a central portion to increase the mechanical strength of the right and left posts themselves, and mounting portions 106 and 126 located in the rear and formed with threaded openings, not shown, for mounting a back plate 160. The ceiling board 140, floor plate 160 and back board 150 are threadably connected, not shown, to the left post 120 and the right post 100 of the aforesaid construction.

Hook mounting openings 107, 108, 127 and 128 for handling the posts 100 and 120 in transporting them are formed in an uppermost portion and a lowermost portion of the bent portions 105 and 125. The mounting portions 106 and 126 and the bent portions 105 and 125 define therebetween spaces 109 and 129 respectively which serve as handling spaces when the posts 100 and 120 are transported on the condition that the back board 160 is handled by being placed on the floor in a lying position.

As can be clearly seen from a comparison of the casing structure according to the invention shown in FIG. 8 with that of the prior art shown in FIG. 1, the former offers many advantages lacking in the latter. Particularly the side posts according to the invention can perform a variety of functions although they are rather simple in form and construction, so that the component parts of the casing structure can be reduced in number and transportation and storing of the casing are facilitated. Additionally the casing according to the invention lends itself to automated painting, so that the casing according to the invention is simple in construction and low in cost.

The casing according to the invention mounts shelves 171 (in FIG. 8 only one shelf 171 is shown but in actual practice a plurality of shelves 171 are arranged vertically in superposed relation) between the left post 120 and the right post 100 as indicated by dash-and-dot lines, each shelf 171 including a plurality of electronic circuit packages 170. Attention is directed to the fact that cables 180 connected to the plurality of electronic circuit packages 170 through connectors extend from above the ceiling board 140 past the outer side of the right post 100 to the front of the shelf 171. Thus the side post (right post 100) which constitutes one of the features of the invention has the function of physically separating the cables 180 from the side of the shelf 171, so that a protection can be provided to the cables 180 when the shelves 171 are introduced and removed.

The shelves 171 are mounted in the casing following completion of assembling thereof. The steps to be followed in the process of assembling the casing will now be described by referring to FIGS. 8 and 9.

As shown in FIG. 8, the ceiling board 140, floor board 150 and back board 160 are threadably connected to the right post 100 and the left post 120. A joint bracket 190 of substantially the form of a letter U in a lying position formed with a threaded opening 191 and a mounting opening 192 is connected by a screw 193 to the left side of the floor board 150. A hinge bracket 200 formed with mounting openings 201, 202, 203 and 204 and an upwardly extending projection 205 is connected to the right side of the floor board 150 by a screw 206.

A joint plate 210 formed with threaded openings 211 and 212 and mounting openings 213 and 214 is connected to the left side of the ceiling board 140 by screws 215 and 216. A joint plate 220 formed with threaded openings 221, 222, 227 and 228 and mounting openings 223 and 224 is connected to the right side of the ceiling board 140 by screws 225 and 226 after the cables 180 are connected to the shelf 170.

Referring to FIG. 9, on the left side of the casing, a screw 234 is tentatively fitted in the threaded opening 191 in the joint bracket 190, and a left panel 230 formed with a groove 231 and mounting openings 232 and 233 has its groove 231 placed on the screw 234, so as to thereby position the left panel 230. By tightening screws 235 and 234, the left panel 230 can be secured to the joint plate 210 and the joint bracket 190.

On the right side of the casing, a front cover 240 formed with mounting openings 241 and 242 is secured to the joint plate 220 and the hinge bracket 200 by screws 243 and 244 respectively. Then a front door 250 formed with mounting openings 251 and 252 is attached to the casing as follows. A washer 253 is fitted over the projection 205 formed on the hinge bracket 200 and the projection 205 is fitted in the mounting opeing 251 formed in the front door 250. Thereafter a hinge bracket 260 is secured to the joint plate 220 by a screw 262 while a projection 261 on the hinge bracket 260 is inserted in the mounting opening 252 formed in the front door 250. Thus the front door 250 is supported for movement between an open position and a closed position about the projections 205 and 261. Although not shown, the front door 250 is provided with a handle and locking means is mounted between the front door 250 and the left panel 230.

A right panel 270 is connected to the joint plate 220 and the hinge bracket 200 in the same manner as described hereinabove by referring to the left panel 230. Finally a top plate 280 and a top cover 290 are threadably connected to an upper portion of the front and an upper portion of the back of the ceiling board 140 respectively.

A plurality of shelves, like the shelf 171 shown in FIG. 8, are mounted in a plurality of layers in the casing assembled as described hereinabove, and the cables 180 are connected to the predetermined electronic circuit packages 170 in the shelves 171 through connectors 181, to thereby complete the assembling of the electronic equipment.

According to the invention, the basic structural features include the right post and the left post of the casing which have a variety of functions in spite of them being rather simple in conducive. This is conducive to a reduction in the number of component parts and the ease with which transportation and storing of the parts are carried out. Moreover, the casing can have a coat of paint applied by automated devices, and protection is provided to the cables in the casing. Thus the casing construction provided by the invention is low in cost and high in reliability, and has a high industrial value.

The right post 100 and the left post 120 according to the invention offer additional advantages. Generally electronic equipment, such as a communication apparatus, comprises convection inducing plates for promoting convection of air currents, beacuse the electronic circuit packages generate heat. The right post 100 and the left post 120 according to the invention each have a mounting portion allowing a convection inducing plate to be mounted readily by a simple construction. The details of such mounting portion will be described in some detail by referring to FIGS. 10 and 11.

Figures 10, 11, 12, 13, 14:
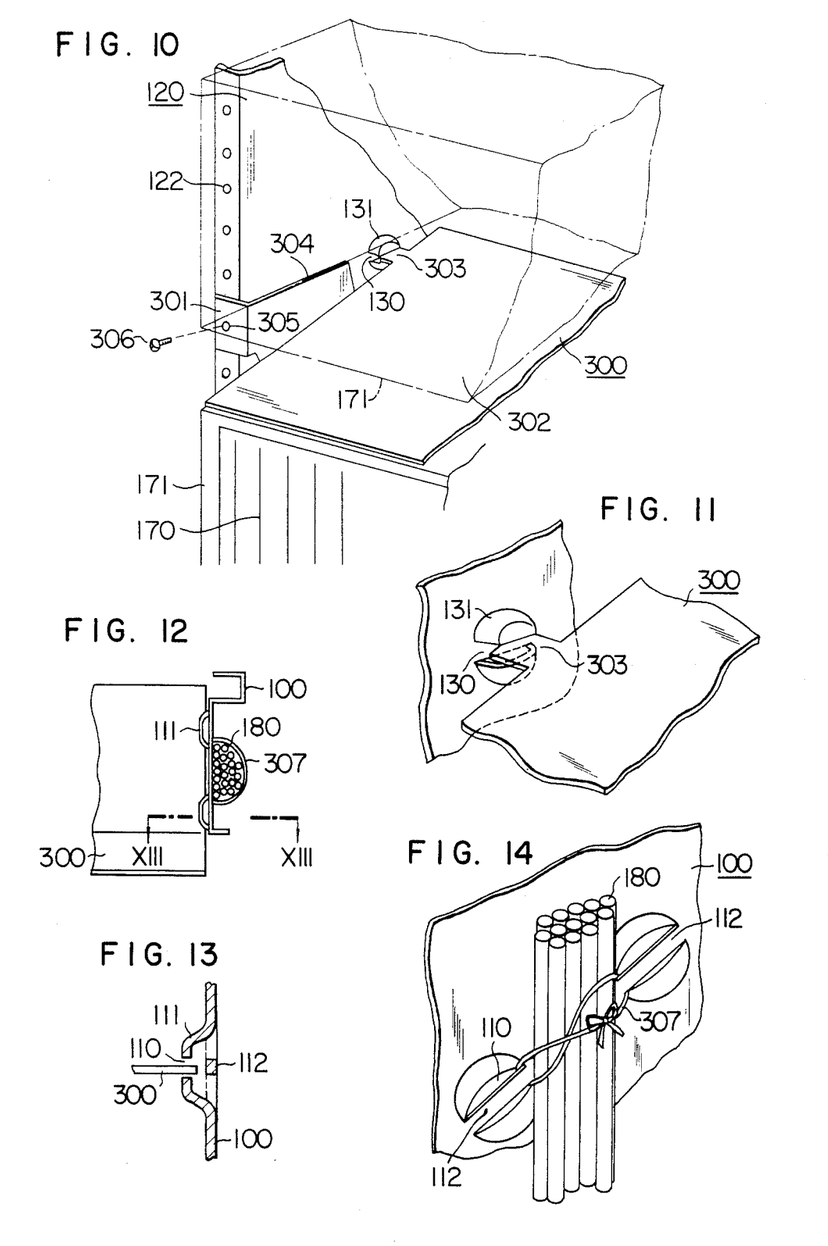
FIG. 10 is a perspective view of the left post according to the invention, showing its essential portions.
FIG. 11 is an enlarged view of the essential portions of the left post shown in FIG. 10.
FIG. 12 is a top plan view of the right post according to the invention.
FIG. 13 is fragmentary front view of the right post shown in FIG. 12.
FIG. 14 is a perspective view of the right post shown in FIG. 12.

Referring to FIG. 10, a convection inducing plate 300 includes a front side fixing portion 301 bent and connected to one side thereof, an inclined surface 302 angled with respect to the horizontal, and a protuberance 303 formed in a suitable position on one side of the plate 300 near the rear of the casing. A horizontal end portion 304 extends along the side of the plate 300 toward the rear of the casing at a right angle to the front side fixing portion 301 formed with a threaded opening 305 adapted to be indexed with one of the threaded openings 122 formed in the left post 120 for receiving a screw 306. As shown in detail in FIG. 11, the left post 120 has a drawn portion 131 formed with a slit 130 in a position corresponding to that of the protuberance 303. The right post 100 is machined in the same manner as described by referring to FIG. 11 in a position symmetrical with the position of machining in FIG. 11.

Fixing of the convection inducing plate 300 to the right post 100 and the left post 120 will be described. The convection inducing plate 300 is forced into the casing from the front side until the protuberance 303 is inserted in the slit 130, and then the front side fixing portion is secured in place by the screw 306.

The shelves 171 are mounted in the casing by forcing them thereinto while sliding on the horizontal end portion 304 of the convection inducing plate 300. When necessary, the shelves 171 may be threadably connected to the right post 100 and the left post 120 in the front of the casing.

By using the right post 100 and the left post 120 according to the invention, it is possible to support the convection inducing plate 300 without using screws in the rear portion of the casing. Thus this support structure can bear a member of heavy weight. More specifically, the convection inducing plate 300 serves concurrently as a ledge for supporting the shelf 171 immediately above it. Also, the invention enables the convection inducing plate 300 to be supported at an accurate inclination angle to enable the plate 300 to function satisfactorily. Thus the convection inducing plate 300 according to the invention has a very high practical value.

An example in which the drawn portion 131 for fixing the convection inducing plate 300 in place is advantageously utilized will be described, by referring to FIGS. 12-14. More specifically, a portion formed by a drawing operation is utilized as a band attaching portion for securing the cables 180.

FIG. 12 is a top plan view showing the right post 100 formed with two drawn portions 111 to provide a slit 110 receiving the convection inducing plate 300 inserted therein. FIG. 13 is a front view of the essential portions shown in FIG. 12, and FIG. 14 is a perspective view of the essential portions shown in FIG. 12.

As shown in FIG. 13, the right post 100 (left post 120) is formed by means of a press with the drawn portion 111 and a strip 112. The slit 110 is formed in a position corresponding to the strip 112 to allow the convection inducing plate 300 to be inserted therein. A band 307 is connected to the strip 112 as shown in FIG. 14, to thereby secure the cables 180 in place.

By utilizing the portion left behind by the operation of forming the drawn portions 111, it is possible to eliminate the need to use a member which is otherwise required for winding the band 307 to secure the cables 180 in place. This is conducive to a reduction in cost.

Two examples of the shelf 171 mounted between the right post 100 and the left post 120 will be described by referring to FIGS. 15 and 16.

A shelf construction of the prior art in the form of a four-sided member has an L-shaped metal fixture attached by welding to one side to serve as a mounting portion for mounting the shelf in the casing, and a handle for withdrawing the shelf is attached to the front of the shelf or backing in some shelves. Thus the shelf construction of the prior art in high in cost and difficult to handle.

Figure 15:
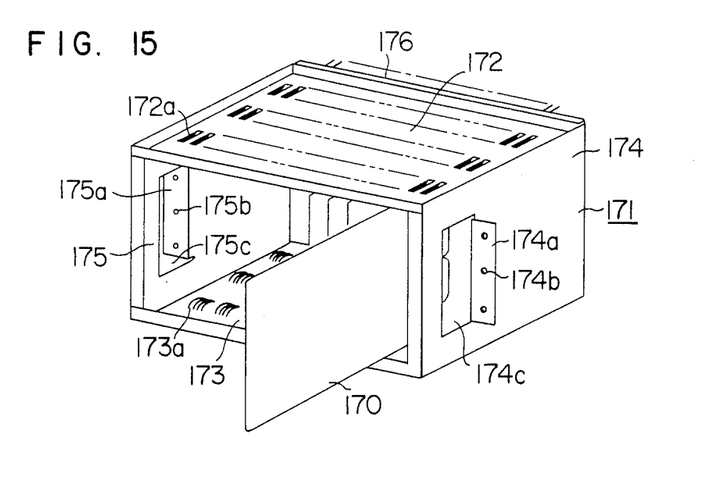
FIG. 15 is a perspective view of a shelf according to the invention.

The embodiment shown in FIG. 15 comprises a shelf formed at a side plate on either side of the shelf with a cut and raised portion in a position near the front and the bent portion produced by cutting and raising the material is used as a mounting portion while the rectangular opening is used as a handle.

Referring to FIG. 15, the shelf 171 includes an upper plate 172, a lower plate 173 and two side plates 174 and 175, which are connected together as by rivets. The upper plate 172 and the lower plate 173 are formed with a plurality of guides 172a and 173a arranged depthwise and also in several rows widthwise of the shelf 171 for guiding the electronic circuit packages 170 as they are inserted in the shelf 171. A wiring board 176 supporting connectors for electric connection with the electronic circuit packages 170 is attached to the rear of the upper and lower plates 172 and 173. The side plates 174 and 175 are formed with mounting portions 174a and 175a respectively by cutting and raising the material of the plates 174 and 175, and openings 174b 175b are formed in the mounting portions 174a and 175a respectively for mounting the shelf 171 on the right post 100 and the left post 120. Rectangular openings 174c and 175c formed by cutting and raising the material which are each large enough to receive four fingers serve as handles.

As aforesaid, by cutting and raising the material of the side plates, it is possible to eliminate the need to use handles and mounting portions which are joined by welding to the shelf 171 and to use the rectangular openings formed by cutting and raising the material as handles while using the bent portions as mounting portions. Thus the shelf according to the invention is low in cost, easy to handle and high in industrial value.

Figure 16:
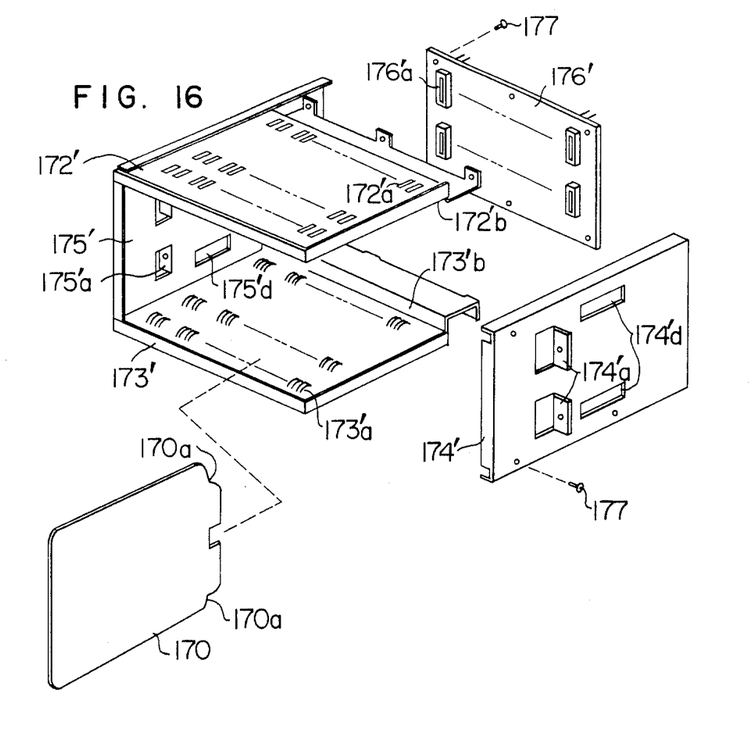
FIG. 16 is an exploded perspective view of a modified form of shelf according to the invention.

FIG. 16 shows an improved form of the shelf 171 shown in FIG. 15 in which the shelf consists of three standardized parts, to achieve simplification of administation of storing of the parts and increased efficiency in the production of shelves.

As shown, a pair of upper and lower plates 172' and 173' and a pair of side plates 174' and 175' are of the identical shape and connected together by rivets (or screws) 177. A back wiring board 176' supporting connectors 176'a is connected to the upper and lower plates 172' and 173' by rivets (or screws) 177.

The upper and lower plates 172' and 173' are formed with guides 172'a and 173'a a respectively for guiding the movement of the electronic circuit packages 170 inserted in the shelf 171 and stoppers 172'b and 173'b respectively for shoulders 170a in upper and lower rear ends of the electronic circuit packages 170 to abut thereagainst, so as to regulate the position in which each of the electronic circuit packages 170 is located in the shelf 171.

The pair of side plates 174' and 175' are formed by cutting and raising the material thereof with mounting portions 174'a and 175'a for mounting the side plates 174' and 175' on the right post 100 and left post 120 respectively. The side plates 174' and 175' can be mounted on the right and left posts 100 and 120 as by screwing by utilizing the mounting portions 174'a and 175'a . The numerals 174'd and 175'd designate handles for use when the shelves 171 are transported which can be formed by cutting out the material of the side plates 174' and 175'.

In the shelf construction shown in FIG. 16, the shelf 171 is composed of three standardized parts or plates 172' and 173', plates 174' and 175' wiring board 176'. In spite of the fact that the shelf 171 is of unitary structure, no ledges are required and the shelf 171 can be directly secured to the posts. Thus the shelf 171 according to the invention is low in cost and has a high industrial value.

In the invention, the casing of a unitary structure shown in FIGS. 8 and 9 can be arranged in side-by-side relation in a plurality of number without any trouble in accordance with the scale of the electronic equipment. This particular feature of the invention will be described by referring to FIGS. 17–19.

Figure 17:
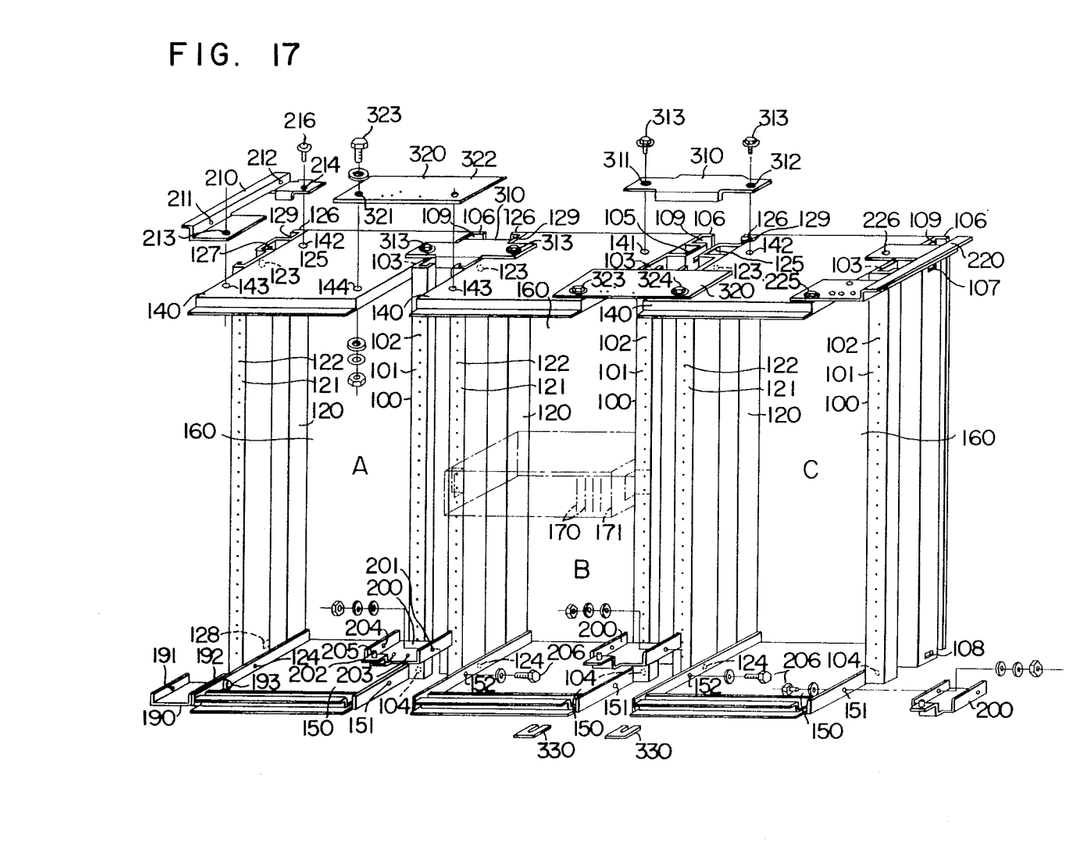
FIGS. 17 and 18 are perspective views of a three-piece casing construction according to the invention, showing the manner in which the casings are assembled.
Figure 18:
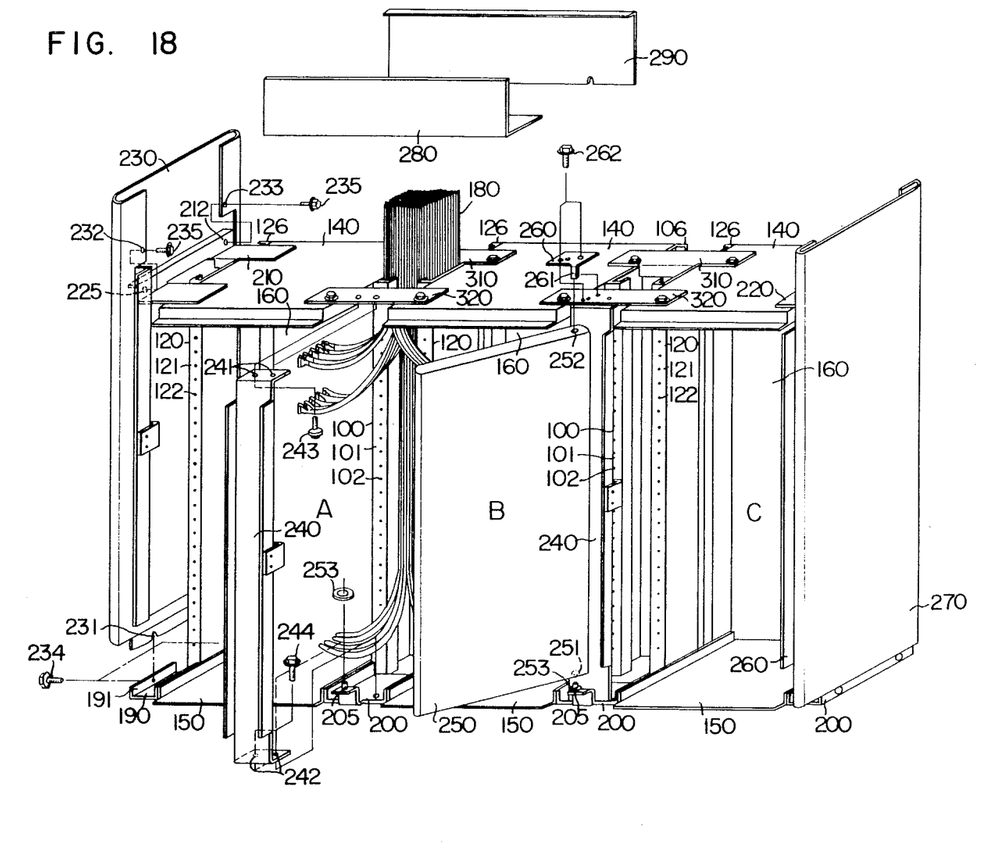

FIGS. 17 and 18 are fragmentary exploded perspective views of the casings showing the process in which they are assembled. Three casings A, B and C are shown as one example.

The right post 100 and the left post 120 used in each of the casings A, B and C are those shown in FIGS. 7–9, and each casing is identical in construction to the casing shown in FIG. 8. Therefore, description of the construction of the individual casing will be omitted and the process in which a series of three casings A, B and C are assembled will only be described.

The joint bracket 190 substantially in the form of a letter U in a lying position formed with the threaded opening 191 and the mounting opening 192 is threadably connected by the screw 193 to the left side of the floor board 150 of the casing A. The left post 120 of the casing B is moved close to the right post 100 of the casing A in a manner to be disposed substantially adjacent thereto, and the two casings A and B are interconnected by the hinge bracket 200. The hinge bracket 200 is formed with the mounting openings 201–204 and the upwardly extending projection 205, and the floor boards 150 of the casings A and B are formed on the right side and the left side with the mounting openings 151 and 152 in positions corresponding to those of the mounting openings 204 and 201 respectively, so that they are interconnected by the screws 206 (only one screw 206 being shown). Likewise, the casing C is connected to the right side of the casing B by the hinge bracket 200, and the hinge bracket 200 is connected to the right side of the floor plate 150 of the casing C. In this way, the casings A, B and C are positioned relative to one another in such a manner that the spacing between the right post 100 and the left post 120 is in the range between 0 and 1 mm.

The casings A, B and C are connected together in the upper portions thereof as follows. The ceiling boards 140 of the casings A, B and C are each formed with threaded openings 141 and 142 and mounting openings 143 and 144, and the casings A and B and B and C are connected together by one of joint plates 310. The joint plates 310 are each formed with mounting openings 311 and 312 in positions corresponding to those of the threaded openings 141 and 142 formed in the ceiling boards 140 for connecting the two casings together by screws 313. Thus positioning of the casings depthwise thereof is completed. Joint plates 320 are each used for interconnecting the adjacent two casings of the series of casings A, B and C. Prior to attaching the joint brackets 320, the cables 180 are inserted in spaces between the posts 100 and 120 of the adjacent casings as shown in FIG. 18, for example. The cables 180 having a substantial bundle volume are moved in the form of a bundle from one side of the open posts 100 and 120 to be placed in a predetermined position.

After the cables 180 are inserted as aforesaid, the joint plates 210 and 220 formed with the mounting openings 210–214 are connected by screws 215, 216 and 225, 226 to the left side of the casing A and the right side of the casing B respectively, and the joint plates 320 each formed with mounting openings 321 and 322 are connected between the casings A and B and B and C respectively by screws 323 and 324.

Aligning of the components of each casing in a vertical direction is effected by means of a liner 330 attached to the floor before the casing in installed with respect to the rear end of the casing, and also by means of a liner 330 inserted from the front side after the casings A, B and C are arranged in side-by-side relation with respect to the front end of the casings. This eliminates the need to carry out installing of the casings from the rear and allows the casings A, B and C to be arranged in front of a wall.

After the casings A, B and C are assembled in the manner shown in FIG. 17, they are further assembled as shown in FIG. 18. A screw 334 is tentatively inserted in the opening 191 formed in the joint bracket 190 on the left side of the casing A and the left panel 230 formed with the groove 231 and mounting openings 232 and 233 has its groove 231 placed on the screw 234 so as to thereby position the left panel 230. By tightening the screws 235 and 234, the left panel 230 can be secured to the joint plate 210 and the joint bracket 190.

Then, on the right side of each of the casings A, B and C, the front cover 240 formed with the mounting openings 241 and 242 is secured to a joint plate 320 and the hinge bracket 200 by screws 243 and 244 respectively. Thereafter the front door 250 formed with the mounting openings 251 and 252 is connected to each of the casings A, B and C as follows. The washer 253 is fitted over the projection 205 formed on the hinge bracket 200 and the projection 205 is fitted in the mounting opening 251 formed in the front door 250, and the projection 261 on the hinge bracket 260 is inserted in the mounting opening 252 formed in the front door 250, so that the hinge bracket 260 can be secured to the joint plate 320 by the screw 262. Thus the front door 250 is hingedly supported at the projections 205 and 261 for movement between open and closed positions. Although not shown, a handle is provided to the front cover 250, and lock means is provided to each of the front door 250, left panel 230 and front cover 240.

In the same manner as the left panel 230 is connected to the joint plate 210 and hinge bracket 200, the right panel 270 is connected to the joint plate 220 and hinge bracket 200 on the right side of the casing C. Finally, the top plate 280 and top cover 290 are threadably connected to the upper portion of the front of the ceiling board 140 and the upper portion of the rear thereof respectively. The series of three casings assembled as aforesaid are shown in a front view in FIG. 19.

Figure 19:
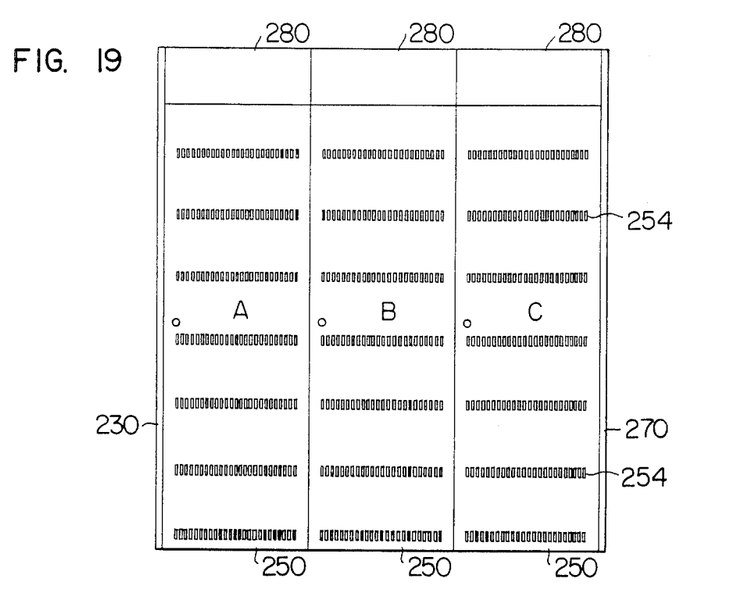
FIG. 19 is a front view of the three-piece casing construction upon completion of assembling.

In FIG. 19, a plurality of openings 254 are formed in the front door 250 (they are not shown in FIGS. 9 and 18) for drawing air therethrough into the casing for effecting cooling of the electronic circuit packages 170.

The casing construction according to the invention as described hereinabove offers the following advantages:

(1) Levelling of the casings in directions extending from front to rear and from left to right can be readily achieved with respect to the right and left posts and the mounting portions, making it possible to reduce the number of levelling steps in the process of assembling the casings. Moreover, assembling can be carried out with the operator standing in front of the casing, enabling the casing to be installed in a position with the back facing a wall.

(2) The cables can be connected to the electronic circuit packages in the shelves without any front cover and front door being connected to the casing which is open in the front, making it possible to pass the cables by the front of the casing with increased efficiency.

(3) The ceiling board and the floor board extend forwardly further than is usual for accommodating the cables connected to the electronic circuit packages, so that the front door can be secured to the front portions of the ceiling board and the floor board without interfering with the cables. This reduces the number of component parts of the casing and the number of steps required for assembling the casing.

Figure 20:
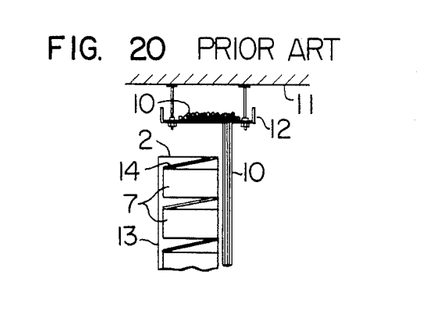
FIG. 20 is a right side view of a casing of the prior art.

An embodiment of the invention will now be described by referring to FIGS. 20-23 with special reference to the construction of a cable rack. It has hitherto been customary to have cables 10 supported on the cable rack 12 hung from a ceiling 11 of a shed and pass the cables 10 along a side of a communication apparatus casing 13 immediately above the latter, as shown in FIG. 20. Convection inducing plates 14 are mounted above and below a plurality of shelves in the communication apparatus casing 13 for releasing heat to outside.

The arrangement whereby the cable rack 12 is located near the ceiling 11 of the shed increases the quantity of the material required for fabricating the cable rack 12 and the number of steps for fabricating same. The shed itself is required to have a considerably large height, and it is necessary to study the skeleton structure of the ceiling of the shed beforehand and to prepare the shed as a special communication apparatus chamber. The communication apparatus casing 13 has hitherto had no ventilating ports formed in a ceiling board 2, so that it is necessary to provide the convection inducing plate 14 above the topmost shelf 7. This has increased the height of the casing, thereby involving an increase in cost.

According to the invention, the casing is provided with a cable rack serving concurrently as a convection inducing plate in the ceiling. The invention will be described in detail by referring to the drawings.

Figure 21:
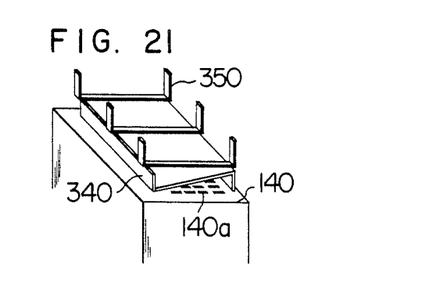
FIG. 21 is a perspective view of an upper portion of the casing according to the invention.
Figure 22:
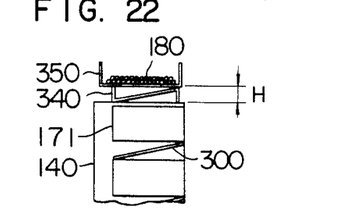
FIG. 22 is a right side view of the upper portion of the casing shown in FIG. 21.

FIG. 21 shows the ceiling board 140 according to the invention formed with a multiplicity of rectangular openings 140a for ventilation. As shown in FIG. 22, hot air produced by heat generation in the uppermost shelf 171 flows upwardly through the rectangular openings 140a in the ceiling board 140. A convection inducing plate 340 inclined in going from the front side to the rear side to allow a current of air to flow in the indicated direction is mounted on an upper portion of the ceiling board 140. The convection inducing plate 340 has a height H which is set at a value such that the current of hot air flows smoothly and no trouble occurs when the cables 180 are bent in passing same along the side of the casing. The convection inducing plate 340 is provided with a cable rack 350 substantially in the form of a letter U in a lying position for supporting the cables 180.

Figure 23:
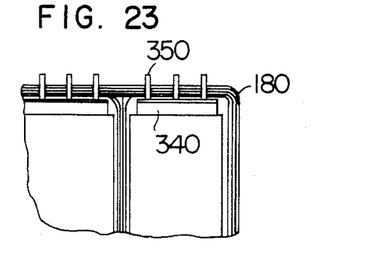
FIG. 23 is a front view of the upper portion of the casing shown in FIG. 21.

In the embodment shown in FIGS. 21-23, the casing can be installed without any involvement of the ceiling of the shed. Since the cable rack construction allows the cable rack to serve concurrently as a convection inducing plate, the material and the number of steps required in operation can be reduced and assembling can be carried out with increased efficiency. The height of the casing can be reduced by an amount corresponding to the thicknesses of the convection inducing plates and cost can be reduced, because the convection inducing plates in the upper portion of the casing can be eliminated. The cables can be introduced into the casing according to the invention from below the floor.

What is claimed is:

1. A casing construction for electronic equipment including a plurality of shelves mounted therein, comprising:
    (a) a left post and a right post forming a pair, each having a large width and comprising:
        a first mounting portion at the front for mounting a plurality of shelves;
        a second mounting portion located in the vicinity of the upper end for mounting a ceiling board; and
        a third mounting portion located in the vicinity of the lower end for mounting a floor board;
    (b) a ceiling board mounted on said second mounting portions of said left post and right post; and
    (c) a floor board mounted on said third mounting portions of said left post and right post;
    wherein said left post and right post forming a pair are each formed by a single member with a reinforcing bent portion disposed sightly toward the rear as viewed widthwise of the posts, said reinforcing bent portion projecting outwardly of a plane connecting the second and third mounting portions together as viewed widthwise of the casing, and wherein a space defined by the bent portion, second mounting portion and third mounting portion forms a space for holding cables.

2. A casing construction as claimed in claim 1, wherein cables reaching a front surface of the shelves are passed around the outer side of at least one of said left post and right post to said space.

3. A casing construction as claimed in claim 1, wherein said left post and right post forming a pair are each formed with hook openings for use in transportation at least at one end thereof.

4. A casing construction for electronic equipment including a plurality of shelves mounted therein, comprising:
    (a) a left post and a right post forming a pair, each having a large width and comprising:
        a first mounting portion at the front for mounting a plurality of shelves;
        a second mounting portion located in the vicinity of the upper end for mounting a ceiling board; and
        a third mounting portion located in the vicinity of the lower end for mounting a floor board;
    (b) a ceiling board mounted on said second mounting portions of said left post and right post; and
    (c) a floor board mounted on said third mounting portions of said left post and right post;
    wherein said left post and right post forming a pair are each formed with a drawn portion at one part widthwise thereof for receiving a portion of a convection inducing plate and supporting same; and
    wherein a band for holding the cables in place is supported on the outside of at least one of said left and right posts in a slit formed when said drawn portion thereof is formed.

5. A casing construction for electronic equipment including a plurality of shelves mounted therein, comprising:
    (a) a left post and a right post forming a pair, each having a large width and comprising:
        a first mounting portion at the front for mounting a plurality of shelves;

a second mounting portion located in the vicinity of the upper end for mounting a ceiling board; and a third mounting portion located in the vicinity of the lower end for mounting a floor board;

(b) a ceiling board mounted on said second mounting portions of said left post and right post; and (c) a floor board mounted on said third mounting portions of said left post and right post;

wherein said left post and right post forming a pair are each formed with a drawn portion at one part widthwise thereof for receiving a portion of a convection inducing plate and supporting same; and wherein a convection inducing plate is supported by said drawn portions of said left and right posts, said convection inducing plate including a horizontal portion for supporting the lower end of a shelf.

6. A casing construction for electronic equipment including a plurality of shelves mounted therein, comprising:

(a) a left post and a right post forming a pair, each having a large width and comprising:
a first mounting portion at the front for mounting a plurality of shelves;
a second mounting portion located in the vicinity of the upper end for mounting a ceiling board; and
a third mounting portion located in the vicinity of the lower end for mounting a floor board;

(b) a ceiling board mounted on said second mounting portions of said left post and right post; and (c) a floor board mounted on said third mounting portions of said left post and right post;

wherein said left post and right post forming a pair are each formed with a drawn portion at one part widthwise thereof for receiving a portion of a convection inducing plate and supporting same; and wherein a convection inducing plate is supported by the drawn portions of said left and right posts, said convection inducing plate including a projecting portion extending further outwardly than the front surface of the shelves for holding cables passed along the front surface of the shelves.

7. A casing construction as claimed in claim 1, wherein said ceiling board is formed with ventilating openings and has connected to its upper portion a convection inducing plate including a cable rack attached thereto.

8. A casing construction as claimed in claim 1, wherein said shelves mounted on said left post and right post are each formed with mounting portions on opposite sides thereof by cutting and raising the material of the shelf for mounting the shelf on said first mounting portions, and cutouts formed by cutting and raising the material of the shelf are used as handles.

9. A casing construction as claimed in claim 8, wherein each said shelf includes two identical side plates and a upper plate and a lower plate identical with each other.

10. A casing construction as claimed in claim 1, wherein said ceiling board and said floor board include projecting portions extending from the front surface of the casing, said projecting portions defining a cable space.

11. A casing construction for electronic equipment comprising a plurality of casings each mounting a plurality of shelves, said casings being arranged in side-by-side relation, each said casing at least comprising:

a left post and a right post forming a pair for mounting a plurality of shelves vertically in a plurality of layers, each of said left post and right post being formed by a single member and including a first mounting portion at the front for mounting the plurality of shelves, a reinforcing bent portion disposed slightly toward the rear as viewed widthwise of the posts, a second mounting portion in the vicinity of the upper end for mounting a ceiling board, and a third mounting portion in the vicinity of the lower end for mounting a floor board;

a ceiling board mounted on said second mounting portions; and a floor board mounted on said third mounting portions; wherein said bent portion of each post projects outwardly of a plane connecting the second and third mounting portions together as viewed widthwise of the casing, and wherein a space defined by the bent portion, second mounting portion and third mounting portion forms a space for inserting cables therethrough.

* * * * *